(12) United States Patent
Giusti et al.

(10) Patent No.: US 12,195,327 B2
(45) Date of Patent: Jan. 14, 2025

(54) PIEZOELECTRIC MICROMACHINED ULTRASONIC TRANSDUCER HAVING A POLYMERIC MEMBER OVER A DAMPER CAVITY

(71) Applicant: STMicroelectronics S.r.l., Agrate Brianza (IT)

(72) Inventors: Domenico Giusti, Caponago (IT); Marco Ferrera, Concorezzo (IT); Fabio Quaglia, Pizzale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 662 days.

(21) Appl. No.: 17/497,538

(22) Filed: Oct. 8, 2021

(65) Prior Publication Data

US 2022/0119246 A1   Apr. 21, 2022

(30) Foreign Application Priority Data

Oct. 16, 2020   (IT) .......................... 102020000024466

(51) Int. Cl.
| | |
|---|---|
| *B81B 7/00* | (2006.01) |
| *B81B 3/00* | (2006.01) |
| *B81C 1/00* | (2006.01) |
| *H10N 30/20* | (2023.01) |
| *H10N 30/30* | (2023.01) |

(52) U.S. Cl.
CPC .......... *B81B 7/0016* (2013.01); *B81B 3/0021* (2013.01); *B81C 1/00158* (2013.01); *H10N 30/2047* (2023.02); *H10N 30/308* (2023.02)

(58) Field of Classification Search
CPC . B81B 7/0016; B81B 3/0021; B81C 1/00158; B06B 1/0651; B06B 1/0681; B06B 1/0674; B06B 1/0666; B06B 1/0622; B06B 1/0662; H10N 30/2047; H10N 30/308; H10N 30/101; H10N 30/704
See application file for complete search history.

(56) References Cited

U.S. PATENT DOCUMENTS

| | | |
|---|---|---|
| 7,294,536 B2 | 11/2007 | Villa et al. |
| 2006/0238067 A1 | 10/2006 | Dausch |
| 2008/0261345 A1 | 10/2008 | Villa et al. |

(Continued)

FOREIGN PATENT DOCUMENTS

| | | |
|---|---|---|
| CN | 103458795 A | 12/2013 |
| CN | 106660074 A | 5/2017 |

(Continued)

*Primary Examiner* — Emily P Pham
(74) *Attorney, Agent, or Firm* — Seed IP Law Group LLP

(57) ABSTRACT

A PMUT device includes a membrane element adapted to generate and receive ultrasonic waves by oscillating, about an equilibrium position, at a corresponding resonance frequency. A piezoelectric element is located over the membrane element along a first direction and configured to cause the membrane element to oscillate when electric signals are applied to the piezoelectric element, and generate electric signals in response to oscillations of the membrane element. A damper is configured to reduce free oscillations of the membrane element, and the damper includes a damper cavity surrounding the membrane element, and a polymeric member having at least a portion over the damper cavity along the first direction.

20 Claims, 11 Drawing Sheets

(56) References Cited

U.S. PATENT DOCUMENTS

| | | |
|---|---|---|
| 2009/0107243 A1 | 4/2009 | Sugiura et al. |
| 2010/0168583 A1 | 7/2010 | Dausch et al. |
| 2012/0267986 A1 | 10/2012 | Galluzzo et al. |
| 2014/0214209 A1 | 7/2014 | Sugiura et al. |
| 2016/0288169 A1 | 10/2016 | Bae et al. |
| 2017/0021391 A1 | 1/2017 | Guedes et al. |
| 2018/0153512 A1 | 6/2018 | Akkaraju et al. |
| 2019/0351453 A1* | 11/2019 | Frey .................. B06B 1/0685 |
| 2020/0100033 A1 | 3/2020 | Stoppel et al. |
| 2020/0322730 A1 | 10/2020 | Kamiya et al. |
| 2022/0118480 A1 | 4/2022 | Giusti et al. |

FOREIGN PATENT DOCUMENTS

| | | |
|---|---|---|
| CN | 207287973 U | 5/2018 |
| CN | 109530194 A | 3/2019 |
| CN | 110180770 A | 8/2019 |
| JP | 2001-16694 A | 1/2001 |
| WO | 2011/078218 A1 | 6/2011 |

\* cited by examiner

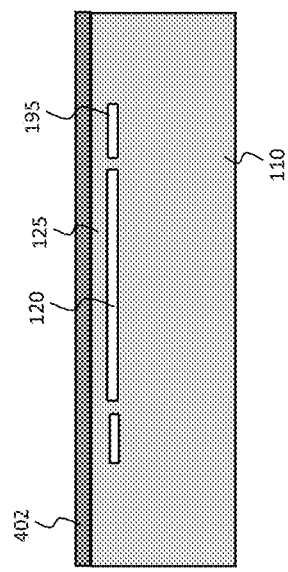
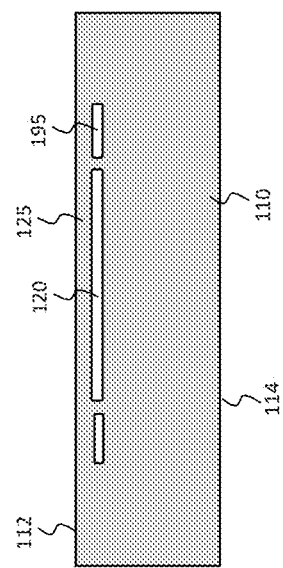
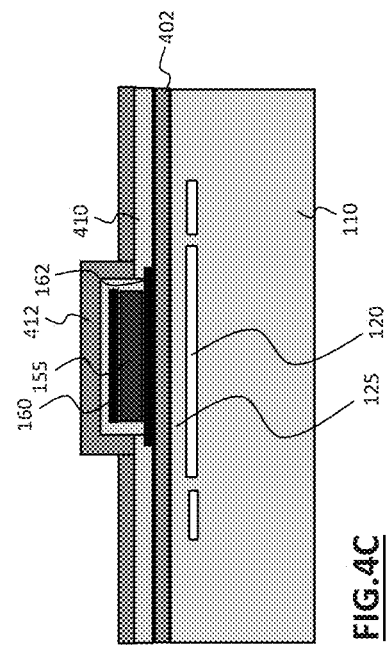

PIEZOELECTRIC MICROMACHINED ULTRASONIC TRANSDUCER HAVING A POLYMERIC MEMBER OVER A DAMPER CAVITY

BACKGROUND

Technical Field

The present disclosure relates to the field of the Micro Electro Mechanical Systems (hereinafter referred to as "MEMS"). Particularly, the present disclosure relates to a Piezoelectric Micromachined Ultrasonic Transducer (hereinafter, referred to as "PMUT").

Description of the Related Art

A MEMS device comprises miniaturized mechanical, electrical and/or electronic components integrated in a same semiconductor material substrate, for example silicon, by means of micromachining techniques (for example, lithography, deposition, etching, deposition, growth).

A Micromachined Ultrasonic Transducer device (hereinafter referred to as "MUT device") is a kind of MEMS device adapted to transmit/receive ultrasonic waves with frequencies above 20 kHz. Among the known MUT devices, the Piezoelectric MUT devices (hereinafter referred to as "PMUT devices") are known. A PMUT device is a MUT device whose operation is based on the flexural motion of one or more thin membrane element mechanically coupled with a thin piezoelectric element.

When the PMUT device operates as a transmitter, the membrane element flexes and oscillates about an equilibrium position under the action of the piezoelectric element when an AC electric signal is applied to the latter. The oscillations of the membrane element thus cause the generation of ultrasonic waves.

When the PMUT device operates as a receiver, ultrasonic waves hitting the membrane element cause the membrane to oscillate about its equilibrium position. The oscillations of the membrane element act on the piezoelectric element, which accordingly generates a corresponding AC electric signal.

During the generation and the reception of ultrasonic waves (i.e., both in the case in which the PMUT device operates as a transmitter and in the case in which the PMUT device operates as a receiver), the membrane element oscillates about its equilibrium position at a corresponding resonance frequency.

A PMUT device can be expediently used in proximity and ranging applications for assessing the position and/or distance of obstacles/targets. More particularly, the PMUT device transmits an ultrasonic wave pulse. When hitting an obstacle/target, the ultrasonic wave pulse is reflected back in the form of an echo wave. The PMUT device receives the echo wave, and converts it in the electric domain to form a corresponding AC electric signal, which is then amplified and processed to extract a time-of-flight information (i.e., the time spent from the transmission of the ultrasonic wave pulse to the reception of the echo wave). The time-of-flight information is then processed for calculating the position and/or distance of the obstacle/target with respect to the PMUT device. This kind of application is usually employed in scenarios in which the ultrasonic wave pulse and the echo wave travels in a low-density medium, such as for example air.

Typical PMUT devices are negatively affected by a low damping factor when operating in a low-density medium, like air, so that undesired free oscillations cannot be efficiently suppressed. Said free oscillations cause the generation of a so-called ringing signal which negatively affect the correct reception and detection of echo waves reflected by obstacles/targets in response to the transmission of an ultrasonic wave pulse.

The higher the Q-factor of the PMUT device, the longer the duration of the ringing signal caused by free oscillations. This problem is exacerbated when the membrane of the PMUT is oscillating in the frequency range of 2 MHz, because the damping factor corresponding to air at these frequencies is particularly low.

In order to mitigate these problem for improving the echo wave detection, the "blind zone" of the PMUT—i.e., the spatial zone where the echo overcome the ringing—and therefore the bandwidth of the PMUT device, should be increased.

According to solutions known in the art, the bandwidth of the PMUT device is increased by providing a damper configured to reduce the free oscillations. For example, the PMUT device may be equipped with a passive or an active damper (an active damper being a damper configured to carry out a counter-phase excitation after an active pulse).

According to another solution known in the art, algorithms are provided to detect decay variation of an envelope of the ringing due to an echo wave.

BRIEF SUMMARY

The Applicant has found that the known solutions for increasing the bandwidth of the PMUT device in order to improve echo wave detection are not efficient because affected by drawbacks.

Particularly, the known solutions employing a passive damper cause a strong power dissipation. Moreover, due to the variation of environmental conditions, the passive dampers of the known solutions cannot easily allow a perfect match with the impedance of the PMUT device.

The known solutions providing for active dampers are negatively affected by impedance matching problems.

The known solutions employing algorithms to detect decay variation of an envelope of the ringing are strongly dependent on the shape of the echo wave and on the obstacle/target.

In view of the above, the Applicant has devised an improved PMUT device having an increased bandwidth that at the same time is not affected by the abovementioned drawbacks affected the solutions known in the art.

An aspect of the present disclosure relates to a PMUT device.

The PMUT device comprises a membrane element adapted to generate and receive ultrasonic waves by oscillating, about an equilibrium position, at a corresponding resonance frequency.

The PMUT device comprises a piezoelectric element located over said membrane element along a first direction and configured to:
  cause the membrane element to oscillate when electric signals are applied to the piezoelectric element; and
  generate electric signals in response to oscillations of the membrane element,
The PMUT device comprises a damper configured to reduce free oscillations of the membrane element.

The damper comprises a damper cavity surrounding the membrane element.

The damper further comprises a polymeric member having at least a portion thereof over said damper cavity along said first direction.

According to an embodiment of the present disclosure, said damper cavity encircles the membrane element along a plane substantially perpendicular to said first direction. According to an embodiment of the present disclosure, the PMUT device further comprises a semiconductor substrate.

According to an embodiment of the present disclosure, said damper cavity is at least partially formed in said semiconductor substrate.

According to an embodiment of the present disclosure, the PMUT device further comprises a central cavity under said membrane element along said first direction.

According to an embodiment of the present disclosure, said damper cavity has at least a portion corresponding to an annulus surrounding the central cavity perpendicularly to said first direction.

According to an embodiment of the present disclosure, the polymeric member has a shape along directions perpendicular to said first direction substantially corresponding to an annulus.

According to an embodiment of the present disclosure, said polymeric member has a viscosity value ranging from 0.3 to 3 kPa*s.

According to an embodiment of the present disclosure, said polymeric member has a Young's modulus value ranging from 0.5 to 2 GPa.

According to an embodiment of the present disclosure, said membrane element comprises monocrystalline silicon.

According to an embodiment of the present disclosure, said polymeric member has a viscosity value ranging from 2 to 4 kPa*s.

According to an embodiment of the present disclosure, said polymeric member has a Young's modulus value ranging from 1 MPa to 10 GPa.

According to an embodiment of the present disclosure, said membrane element comprises polysilicon.

According to an embodiment of the present disclosure, said membrane element comprises porous polysilicon.

Another aspect of the present disclosure relates to an electronic system comprising at least one or more PMUT devices.

Another aspect of the present disclosure relates to a method for manufacturing a PMUT device.

According to an embodiment of the present disclosure, the method comprises the following phases:
  forming a membrane element;
  forming over said membrane element along a first direction a piezoelectric element; and
  forming a damper, said forming a damper comprising:
    forming damper cavity surrounding the membrane element; and
    forming a polymeric member having at least a portion thereof over said damper cavity along said first direction.

BRIEF DESCRIPTION OF THE SEVERAL VIEWS OF THE DRAWINGS

These and other features and advantages of the solution according to the present disclosure will be better understood by reading the following detailed description of an embodiment thereof, provided merely by way of non-limitative example, to be read in conjunction with the attached drawings. On this regard, it is explicitly intended that the drawings are not necessarily drawn to scale (with some details thereof that can be exaggerated and/or simplified) and that, unless otherwise stated, they are simply used for conceptually illustrating the described structures and procedures. Particularly:

FIGS. 4A-4G illustrate main phases of a manufacturing process for manufacturing the PMUT device of FIGS. 1 and 2 according to an embodiment of the present disclosure;

DETAILED DESCRIPTION

Figures 1, 2:
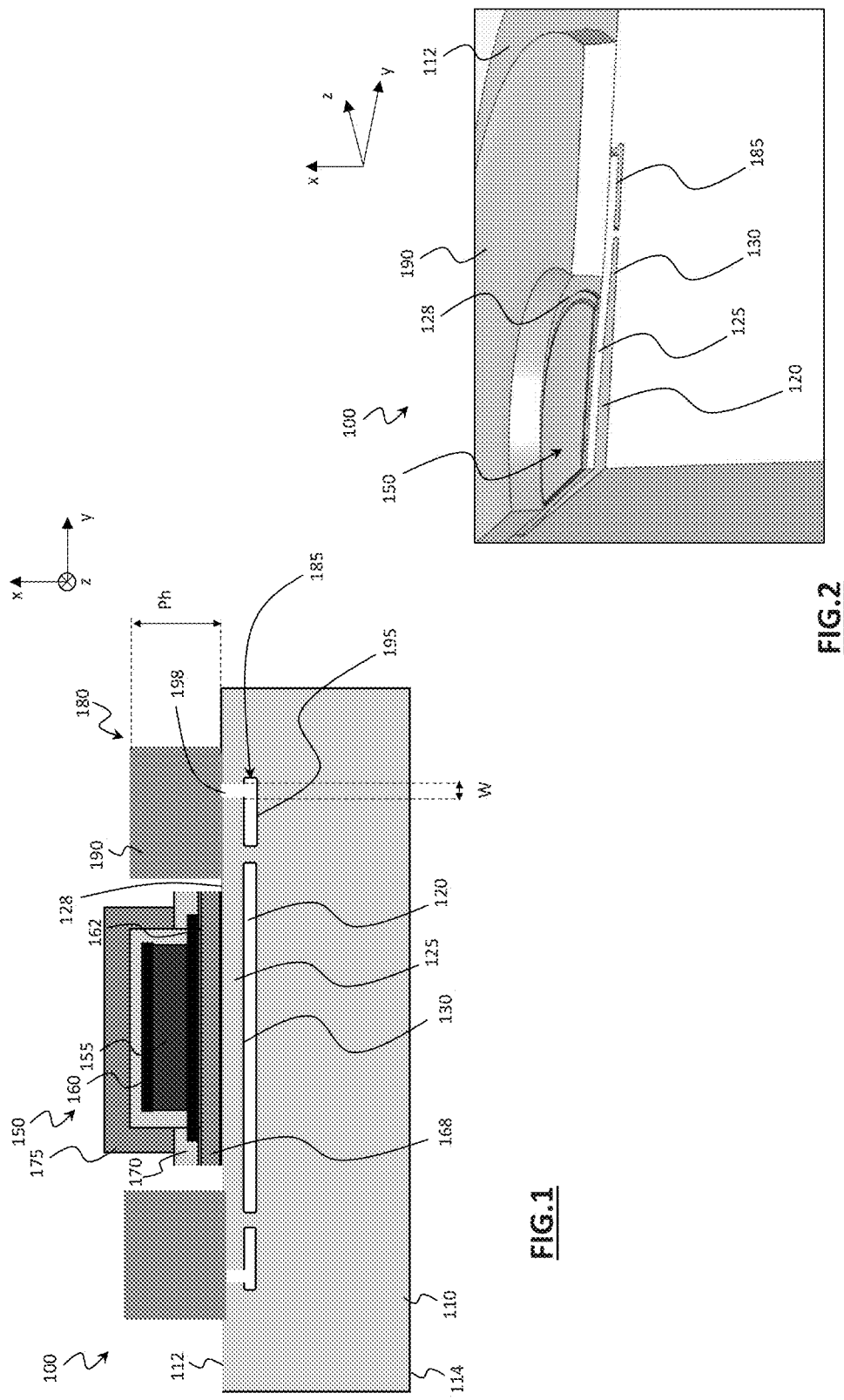
FIG. 1 schematically illustrates a cross section view of a PMUT device according to an embodiment of the present disclosure.
FIG. 2 illustrates a perspective view of a portion of the PMUT device of FIG. 1.

FIG. 1 schematically illustrates a cross section view of a PMUT device, globally identified with reference 100, according to an embodiment of the present disclosure.

In the following of the present description, direction terminology (such as for example, top, bottom, higher, lower, lateral, central longitudinal, transversal, vertical) will be only used for describing the PMUT device 100 in relation to the very specific orientation illustrated in the figures, and not for describing possible specific orientation the PMUT device 100 will have during its operation.

On this regard, a reference direction system is shown including three orthogonal directions X, Y, Z.

According to an embodiment of the present disclosure, the PMUT device 100 has a circular (or substantially circular) shape (along a plane parallel to directions Y and Z). According to other (not illustrated) embodiments of the present disclosure, the PMUT device 100 has different shapes, such as a square (or substantially square) shape, a rectangular (or substantially rectangular) shape, a triangular (or substantially triangular) shape, hexagonal (or substantially hexagonal) shape, or an octagonal (or substantially octagonal) shape.

FIG. 2 illustrates a perspective view of a portion of the PMUT device 100 of FIG. 1 obtained by cutting the PMUT device 100 along a first section plane parallel to directions X and Z which crosses the center of the PMUT device 100, and along a second section plane parallel to directions X and Y which crosses the center of the PMUT device 100.

According to an embodiment of the present disclosure, the PMUT device 100 comprises a semiconductor substrate 110 integrating the components of the PMUT device 100 itself. According to an embodiment of the present disclosure, the semiconductor substrate 110 is a monocrystalline silicon substrate, hereinafter simply referred to as silicon substrate 110. The silicon substrate 110 of the PMUT device 100 illustrated in FIG. 1 has a front operative surface 112 and an opposite (along direction X) back operative surface 114. The front operative surface 112 and the back operative surface 114 extend parallel to directions Y and Z.

According to an embodiment of the present disclosure, the silicon substrate 110 comprises a cavity 120 defining a hollow space delimited by lateral walls extending substantially along the direction X, a bottom wall extending substantially along directions Y and X, and a top wall extending substantially along directions Y and Z. Similar considerations apply in case the lateral walls of the cavity 120 are slanted with respect to the direction X and/or the bottom and/or the top walls of the cavity are slanted with respect to the direction Z and/or to the direction Y.

According to an embodiment of the present disclosure, the PMUT device 100 comprises a membrane element 125 adapted to generate and receive ultrasonic waves by oscillating, about an equilibrium position, at a corresponding resonance frequency. According to an embodiment of the present disclosure, the PMUT device 100 has a resonance frequency that is of the order of few MHz. According to a preferred embodiment of the disclosure, the resonance frequency is 1.1 MHz.

According to an embodiment of the present disclosure, the membrane element 125 has a top surface 128 and a bottom surface 130, extending substantially along directions Y and Z.

According to an embodiment of the present disclosure, the membrane element 125 has a circular (or substantially circular) shape (along a plane parallel to directions Y and Z). According to other embodiments of the present disclosure, the membrane element 125 has different shapes, such as a square (or substantially square) shape, a rectangular (or substantially rectangular) shape, a triangular (or substantially triangular) shape, hexagonal (or substantially hexagonal) shape, or an octagonal (or substantially octagonal) shape.

According to an embodiment of the present disclosure, the bottom surface 130 of the membrane element 125 corresponds to the top surface of the hollow space defined by the cavity 120.

According to an embodiment of the present disclosure, the top surface 128 of the membrane element 125 is flush with the front operative surface 112 of the silicon substrate 110.

According to an embodiment of the present disclosure, the membrane element 125 is made of the same material of the silicon substrate 110, i.e., silicon, particularly monocrystalline silicon.

According to an embodiment of the present disclosure, the membrane element 125 has a thickness (along the direction X) ranging from 2 to 20 μm. According to an embodiment of the present disclosure, the membrane element 125 has a thickness of about 5 μm, for example 5.2 μm.

According to an embodiment of the present disclosure, the membrane element 125 has a diameter ranging from 50 to 1000 μm. According to an embodiment of the present disclosure, the membrane element 125 has a diameter of about 300 μm.

According to an embodiment of the present disclosure, the PMUT device 100 comprises a piezoelectric element 150 located on the top surface 128 of the membrane element 125 and configured to:

cause the membrane element 125 to oscillate when electric signals are applied across the piezoelectric element 150; and generate electric signals in response to oscillations of the membrane element 125.

According to an embodiment of the present disclosure, the piezoelectric element 150 has a circular (or substantially circular) shape (along a plane parallel to directions Y and Z). According to other embodiments of the present disclosure, the piezoelectric element 150 has different shapes, such as a square (or substantially square) shape, a rectangular (or substantially rectangular) shape, a triangular (or substantially triangular) shape, hexagonal (or substantially hexagonal) shape, or an octagonal (or substantially octagonal) shape.

According to an embodiment of the present disclosure, the piezoelectric element 150 comprises a layer of piezoelectric material 155, e.g., comprising aluminum nitride, between a first conductive layer 160 and a second conductive layer 162. According to an embodiment of the present disclosure, the first conductive layer 160 comprises titanium-tungsten (TiW). According to an embodiment of the present disclosure, the second conductive layer 162 platinum. Similar considerations apply if other conductive materials are used for the first and second conductive layers 160, 162.

The first layer 160 and the second layer 162 form electrodes of the piezoelectric element 150 across which it is possible to:

apply electric signals to the piezoelectric material 155 for causing oscillations of the membrane element 125 for transmitting ultrasonic wave pulses; and collect electric signals generated by the piezoelectric material 155 in response to oscillations of the membrane element 125, for example caused by the reception of echo waves.

According to an embodiment of the present disclosure, an insulating material layer 168, e.g., silicon dioxide, is located between the piezoelectric element 150 and the membrane element 125.

According to an embodiment of the present disclosure, the piezoelectric element 150 is covered with a passivation element, for example comprising a first passivation layer 170 (comprising Undoped Silicate Glass (USG)) and a second passivation layer 172 (over the first passivation layer 170) comprising Silicon Nitride. Naturally, similar consideration applies if the passivation element comprise a single passivation layer and/or if different passivation materials are used.

According to an embodiment of the present disclosure, the PMUT device 100 comprises a damper 180 configured to reduce (damp) undesired free oscillations of the membrane element 125, thereby increasing the bandwidth of the PMUT device 100 itself.

According to an embodiment of the present disclosure, the damper 180 comprises a cavity 185 that surrounds the membrane element 125.

According to an embodiment of the present disclosure, the cavity 185 of the damper 180 is formed in the silicon substrate 110 in such a way to surround the membrane element 125 with respect to directions Y and Z.

According to an embodiment of the present disclosure, the damper 180 further comprises a polymeric member 190 over the cavity 185 along direction X.

According to an embodiment of the present disclosure, the polymeric member 190 of the damper 180 is located above the cavity of the damper 180 along direction X.

According to an embodiment of the present disclosure, the polymeric member 190 of the damper 180 surrounds the membrane element 125 with respect to directions Y and X.

According to an embodiment of the present disclosure, the cavity 185 of the damper 180 and the membrane element 125 are substantially concentric to one another, with the cavity 185 that encircles the membrane element 125 along a plane substantially parallel to directions Y and Z.

The presence of the cavity 185 below the polymeric member 190 advantageously ensures that the polymeric member 190 surrounding the membrane element 125 efficiently damps undesired free oscillations affecting the membrane element 125.

According to an embodiment of the present disclosure, the cavity 185 of the damper 180 comprises:

a horizontal portion 195 having a top surface parallel to and aligned with the top wall of the cavity 120 (and therefore parallel to and aligned with the bottom surface 130 of the membrane element 125) and a bottom surface parallel to and aligned with the bottom wall of the cavity 120; and a vertical portion 198 comprising a trench opened in the front operative surface 112 of the silicon substrate 110 and extending along direction X until reaching the horizontal portion 195.

According to an embodiment of the present disclosure, the shape of the horizontal portion 195 of the cavity 185 along directions Z and Y substantially corresponds to an annulus surrounding the cavity 120 along directions Z and Y.

According to an embodiment of the present disclosure, the shape of the vertical portion 198 of the cavity 185 along directions Z and Y substantially corresponds to an annulus surrounding the cavity 120 along directions Z and Y. According to an embodiment of the present disclosure, the width W (intended as the difference between the larger radius and the lower radius of the annulus) of the vertical portion 198 of the cavity 185 has a value ranging from 0.1 to 100 μm. According to an embodiment of the present disclosure, the width W has a value of 5 μm.

According to an embodiment of the present disclosure, the shape of the polymeric member 190 along directions Z and Y substantially corresponds to an annulus.

According to an embodiment of the present disclosure, the polymeric member 190 rests on the front operative surface 112 of the silicon substrate 110 in such a way to cover—along direction X—the vertical portion 198 the cavity 185 of the damper 180.

According to an embodiment of the present disclosure, the height (along direction X) Ph of the polymeric member 190 has a value ranging from 1 to 200 μm. According to an embodiment of the present disclosure, the height Ph has a value of 20 μm.

Thanks to the damper 180 according to the embodiment of the disclosure illustrated in FIGS. 1 and 2, free oscillations of the membrane element 125 can be efficiently reduced, thereby increasing the bandwidth of the PMUT device 100. For example, in the considered example, in which the PMUT 100 has a membrane element 125 oscillating at 1.1 MHz, the % bandwidth centered on 1.1 MHz can advantageously reach 16%.

The damper 180 according to the embodiments of the present disclosure is configured to efficiently damp the free oscillations of the membrane element 125 by properly setting the viscosity and/or the Young's modulus of the polymeric material of the polymeric member 190. Indeed, Applicant has observed that the viscosity of the polymeric material has a very large impact on the % bandwidth, and the Young's modulus of the polymeric material has a quite large impact on the % bandwidth. Conversely, Applicant found that the Poisson's ratio and the density of the polymeric material do not have any significant impact on the % bandwidth.

Figure 3A:
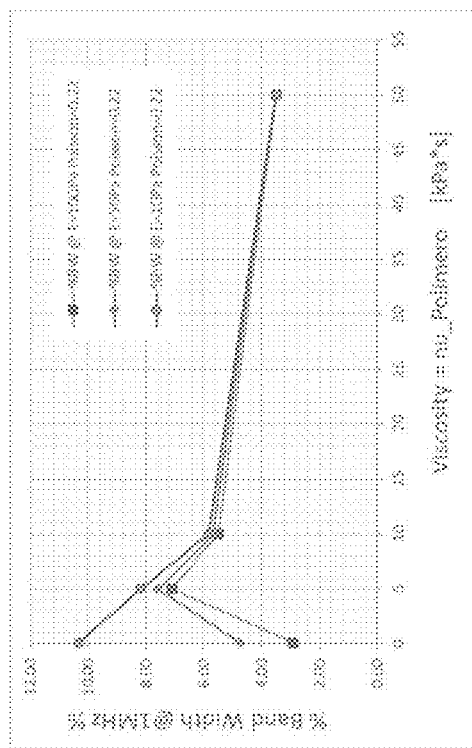
FIG. 3A is a diagram showing the % bandwidth of the PMUT device of FIGS. 1 and 2 as a function of the viscosity and of the Young's modulus of the polymeric material of the polymeric member.

FIG. 3A is a diagram showing the % bandwidth centered on 1 MHz of the PMUT device 100 comprising the damper 180 according to the embodiments of the disclosure illustrated in FIGS. 1 and 2 as a function of the viscosity of the polymeric material of the polymeric member 190 when said polymeric material has a Poisson's ratio of 0.22 and a Young's modulus equal to 10 GPa (square symbol), 5 GPa (diamond symbol) and 1 GPa (circle symbol).

Figure 3B:
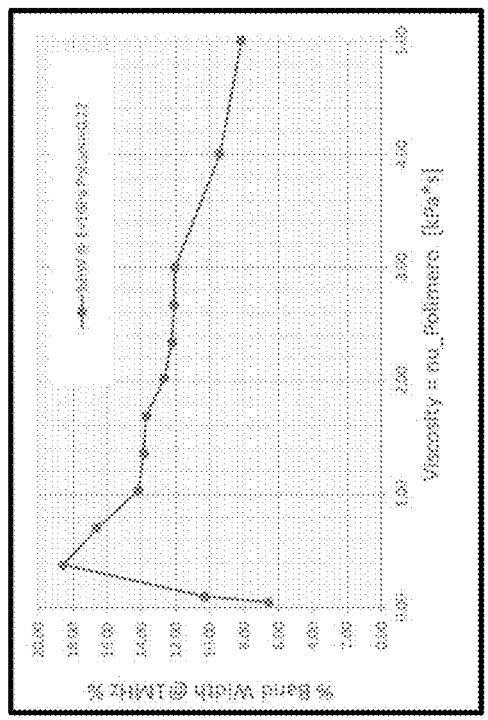
FIG. 3B shows in greater detail an enlarged portion of the diagram of FIG. 3A.

FIG. 3B shows in greater detail an enlarged portion of the diagram of FIG. 3A corresponding to a viscosity range from 0 to 5 kPa*s and to a Young's modulus equal to 1 GPa.

Applicant found that the efficiency of the damper 180 according to the embodiments of the disclosure illustrated in FIGS. 1 and 2 in damping undesired free oscillations of the membrane element 125 is particularly high when:

the viscosity of the polymeric material of the polymeric member 190 has a value ranging from 0.3 to 3 kPa*s; and/or the Young's modulus of the polymeric material of the polymeric member 190 has a value ranging from 0.5 to 2 GPa.

FIGS. 4A-4G illustrate main phases of a manufacturing process for manufacturing the PMUT device 100 of FIGS. 1 and 2 according to an embodiment of the present disclosure.

Making reference to FIG. 4A, the manufacturing process according to this embodiment of the disclosure starts by providing the silicon substrate 110 and then forming in said silicon substrate 110 the cavity 120 and the horizontal portion 195 of the cavity 185 surrounding the cavity 120 itself (see FIG. 1).

According to an embodiment of the present disclosure, the formation of the cavity 120 and of the horizontal portion 195 of the cavity 185 is carried out based on the method disclosed in the U.S. Pat. No. 7,294,536 and in the patent application US 2008/261345 (filed by the same Applicant). Briefly, lithographic masks are used having a honeycomb lattice. Then, using said masks, trench etching of the silicon substrate is performed to form corresponding silicon columns. After the removal of the lithographic masks, epitaxial growth is performed in a deoxidizing environment (e.g., in an atmosphere with a high concentration of hydrogen, preferably using SiHCl3), so that an epitaxial layer grows on top of the silicon columns, trapping gas (H2) present therein. An annealing step is then carried out, causing a migration of the silicon atoms, which tend to arrange themselves in lower energy positions. Consequently, the silicon atoms of the silicon columns migrate completely forming the cavity 120 and of the horizontal portion 195 of the cavity 185.

The portion of the silicon substrate 110 directly over the cavity 120 forms the membrane element 125.

The next phase of the manufacturing process according to this embodiment of the disclosure, illustrated in FIG. 4B, comprises the deposition of an oxide layer 402 on the front operative surface 112, for example by means of a Low pressure Chemical Vapor Deposition (LPCVD using tetraethyl orthosilicate as precursor).

The next phase of the manufacturing process according to this embodiment of the disclosure, illustrated in FIG. 4C, provides for:

- deposing on the oxide layer 402 a stack comprising a layer of piezoelectric material, e.g., comprising aluminum nitride, between two conductive layers, for example a TiW layer and a platinum layer, and patterning said stack to form the piezoelectric element 150 aligned with the cavity 120 by obtaining the layers 155, 160, 162 (see FIG. 1); and
- covering the piezoelectric element 150 with a first passivation layer 410 (comprising USG) and a second passivation layer 412 (over the first passivation layer 410) comprising Silicon Nitride.

Figure 4D:
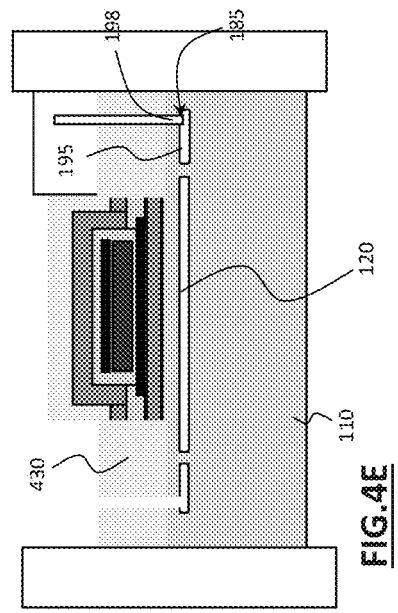

The next phase of the manufacturing process according to this embodiment of the disclosure, illustrated in FIG. 4D, provides for selectively removing the first passivation layer 410, the second passivation layer 412 and the oxide layer 402 using a properly defined lithographic mask 420 to obtain the first passivation layer 170, the second passivation layer 172, and the insulating material layer 168 (see FIG. 1).

Figure 4E:
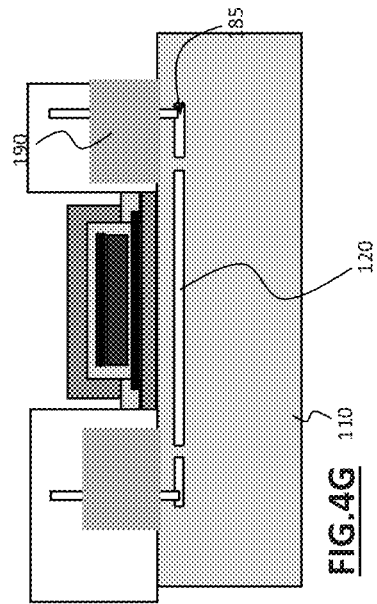

The next phase of the manufacturing process according to this embodiment of the disclosure, illustrated in FIG. 4E, provides for opening a trench in the front operative surface 112 of the silicon substrate 110 over the horizontal portion 195 of the cavity 185 until reaching said horizontal portion 195 in order to form the vertical portion 198 of the cavity 185 (see FIG. 1). According to an embodiment of the present disclosure, this phase is carried out by performing a selective dry silicon etching using a properly defined lithographic mask 430.

Figure 4F:
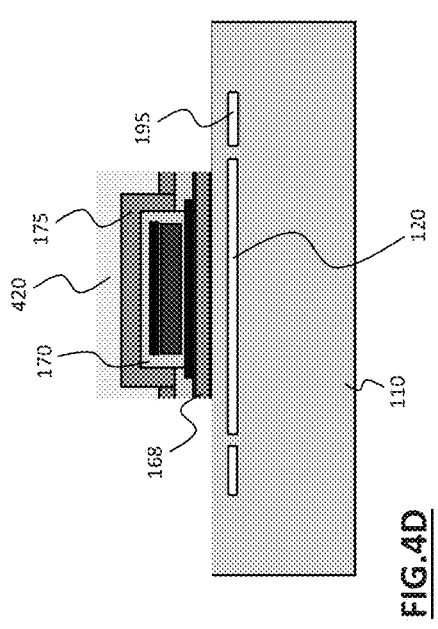

The next phase of the manufacturing process according to this embodiment of the disclosure, illustrated in FIG. 4F, provides for removing the lithographic masks 420 and 430, and then deposing a laminate dry polymer film 440, covering, among others, the horizontal portion 195 of the cavity 185.

Figure 4G:
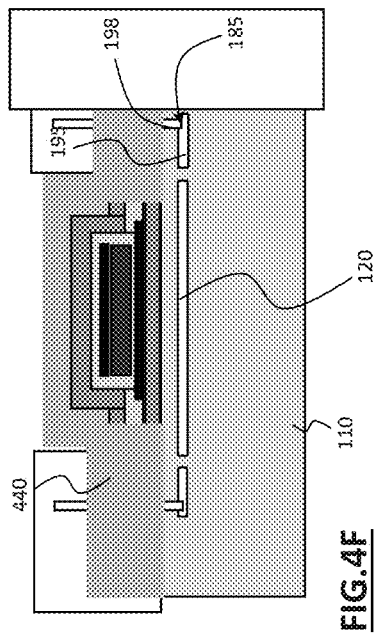

The following phase of the manufacturing process according to this embodiment of the disclosure, illustrated in FIG. 4G, provides for selectively removing the laminate dry polymer film 440 to obtain the polymeric member 190 over the cavity 185 (and then to obtain the PMUT device 100 of FIG. 1).

Figure 5A:
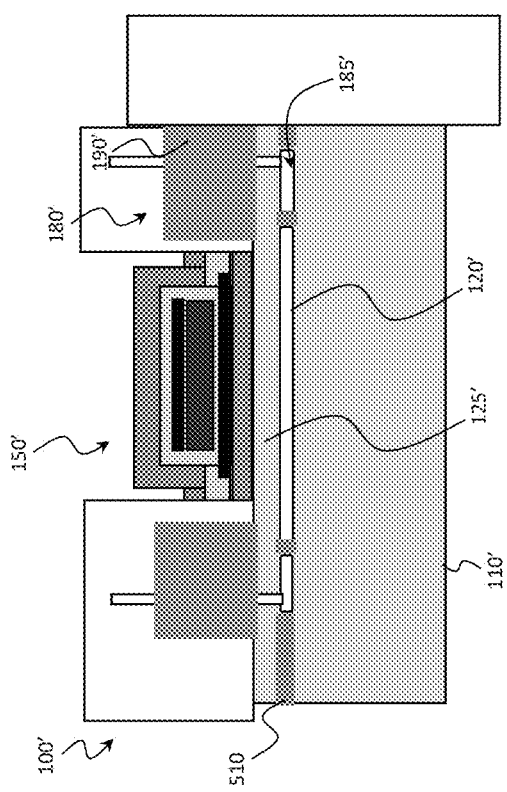
FIGS. 5A and 5B show PMUT devices according to other embodiments of the present disclosure.

FIG. 5A shows a different version of the PMUT device 100, identified with reference 100', according to another embodiment of the present disclosure. The elements of the PMUT device 100' corresponding to the elements of the PMUT device 100 will be identified using the same references used in FIG. 1 with the addition of an apex, and their description will be omitted for the sake of brevity. Compared to the PMUT device 100 of FIG. 1, and manufactured with the manufacturing process described with reference to FIGS. 4A-4G, the PMUT device 100' is manufactured by forming the cavity 120', and the cavity 185' using as starting substrate a Silicon-On-Insulator (SOI) substrate 110' comprising (starting from the top, and then proceeding along the direction X toward the bottom) an active layer (device layer), a buried oxide layer (box layer), and a support layer (handle layer). According to this embodiment of the disclosure, the cavity 120' and the cavity 185' are realized by selectively removing portions of the box layer, identified in FIG. 5A with reference 510.

Figure 5B:
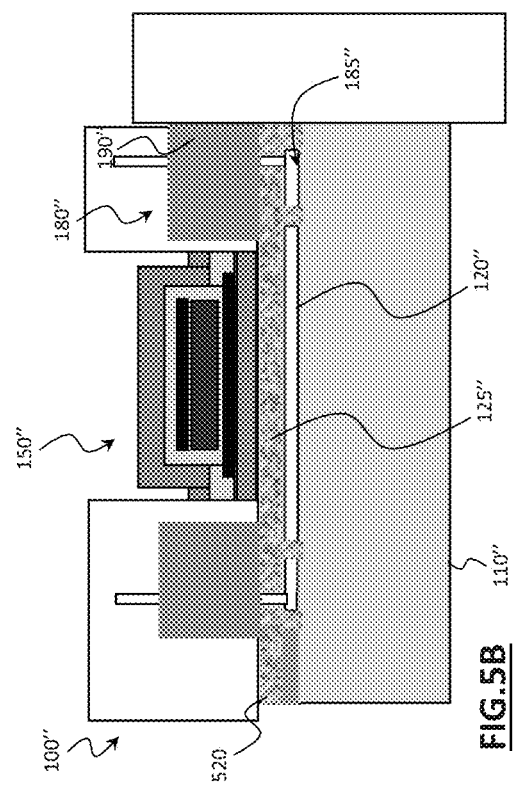

FIG. 5B shows a different version of the PMUT device 100 identified with reference 100", according to another embodiment of the present disclosure. The elements of the PMUT device 100" corresponding to the elements of the PMUT device 100 will be identified using the same references used in FIG. 1 with the addition of a double apex, and their description will be omitted for the sake of brevity. Compared to the PMUT device 100 of FIG. 1, and manufactured with the manufacturing process described with reference to FIGS. 4A-4G, the PMUT device 100" is manufactured by forming the cavities 120" and 185" and the membrane using porous polysilicon 520 deposed on the silicon substrate 110". According to an embodiment of the present disclosure, porous polysilicon 520 is deposed using a LPCVD process at 600° C. from pure silane source gas at 550 mtorr. Thanks to its porosity, the porous polysilicon 520 is permeable to HF etching.

Figure 6:
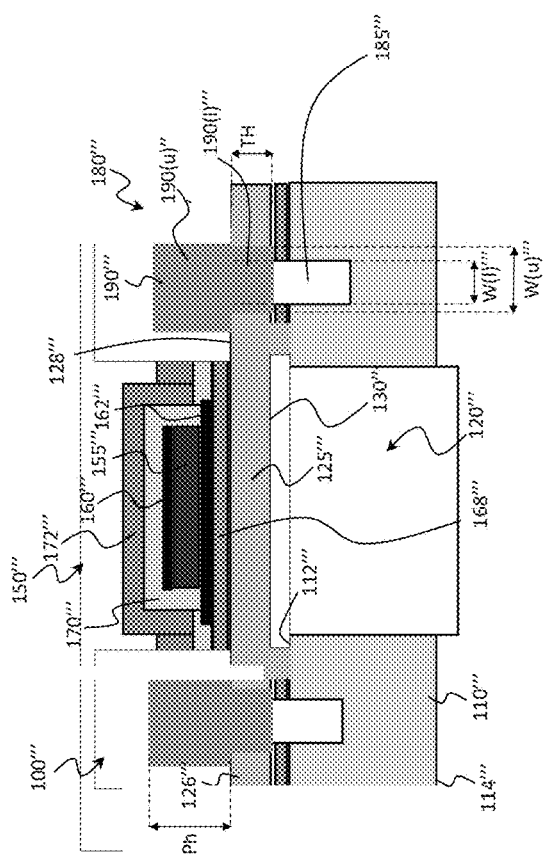
FIG. 6 schematically illustrates a cross section view of a PMUT device according to a still further embodiment of the present disclosure.

FIG. 6 schematically illustrates a cross section view of a PMUT device, globally identified with reference 100''', according to a still further embodiment of the present disclosure.

Figure 7:
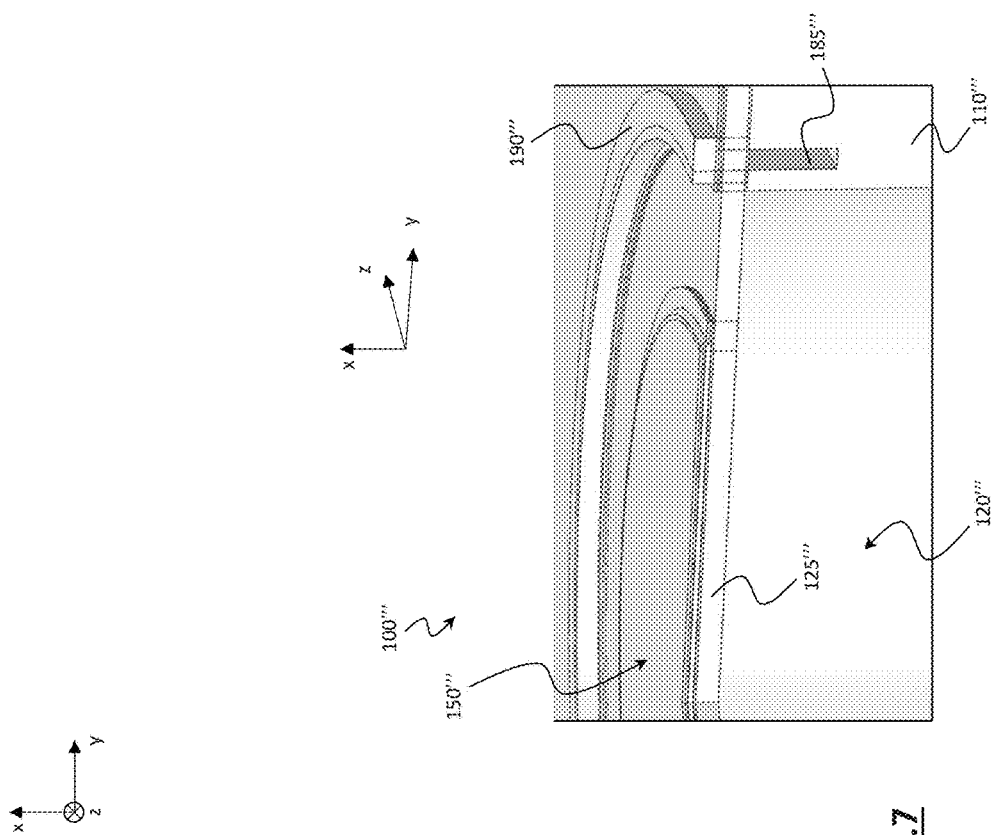
FIG. 7 illustrates a perspective view of a portion of the PMUT device of FIG. 6.

FIG. 7 illustrates a perspective view of a portion of the PMUT device 100''' of FIG. 6 obtained by cutting the PMUT device 100''' along a first section plane parallel to directions X and Z which crosses the center of the PMUT device 100''', and along a second section plane parallel to directions X and Y which crosses the center of the PMUT device 100'''.

According to an embodiment of the present disclosure, the PMUT device 100 comprises a semiconductor substrate 110''' integrating the components of the PMUT device 100''' itself. According to an embodiment of the present disclosure, the semiconductor substrate 110''' is a (monocrystalline) silicon substrate. The silicon substrate 110 of the PMUT device 100 illustrated in FIG. 1 has a front operative surface 112''' and an opposite (along direction X) back operative surface 114'''. The front operative surface 112''' and the back operative surface 114''' extend parallel to directions Y and Z.

According to an embodiment of the present disclosure, the silicon substrate 110''' comprise a cavity 120''' defining a hollow space delimited by lateral walls extending substantially along the direction X, and a top wall extending substantially along directions Y and Z. Unlike the cavity 120 of the PMUT device 100 illustrated in FIG. 1, the cavity 120''' extends along direction X from the front operative surface 112" to the back operative surface 114'''.

Similar considerations apply in case the lateral walls of the cavity 120''' are slanted with respect to the direction X.

According to an embodiment of the present disclosure, the membrane element of the PMUT device 100''', identified with reference 125''', is part of a polysilicon layer 126''' covering located above the front operative surface 112''' of the silicon substrate 110'''.

According to an embodiment of the present disclosure, the membrane element 125''' has a top surface 128''' and a bottom surface 130''', extending substantially along directions Y and Z.

According to an embodiment of the present disclosure, the bottom surface 130''' of the membrane element 125''' corresponds to the top surface of the hollow space defined by the cavity 120'''.

According to an embodiment of the present disclosure, the membrane element 125''' has a thickness (along the direction X) ranging from 1 to 50 μm. According to an embodiment of the present disclosure, the membrane element 125''' has a thickness TH of about 5 μm.

According to an embodiment of the present disclosure, the membrane element 125''' has a diameter ranging from 50 to 1000 µm. According to an embodiment of the present disclosure, the membrane element 125''' has a diameter of about 250 µm.

According to an embodiment of the present disclosure, the PMUT device 100''' comprises a piezoelectric element 150''' located on the top surface 128''' of the membrane element 125'''. According to an embodiment of the present disclosure, the piezoelectric element 150''' is equivalent to the piezoelectric element 150 of the PMUT device 100 of FIG. 1, and accordingly comprises a layer of piezoelectric material 155''' between a first conductive layer 160''' and a second conductive layer 162'''.

According to an embodiment of the present disclosure, an insulating material layer 168''' (e.g., silicon dioxide), is located between the piezoelectric element 150''' and the membrane element 125".

Like the PMUT device 100 of FIG. 1, according to an embodiment of the present disclosure, the piezoelectric element 150''' is covered with a passivation element, for example comprising a first passivation layer 170''' and a second passivation layer 172'''.

Like the PMUT device 100 of FIG. 1, according to an embodiment of the present disclosure, the PMUT device 100" comprises a damper 180''' configured to reduce (damp) undesired free oscillations of the membrane element 125''', thereby increasing the bandwidth of the PMUT device 100''' itself.

According to an embodiment of the present disclosure, the damper 180''' comprises a cavity 185''' that surrounds the membrane element 125'''.

According to an embodiment of the present disclosure, the cavity 185''' of the damper 180''' is formed in the silicon substrate 110''' in such a way to surround the membrane element 125''' with respect to directions Y and X.

According to an embodiment of the present disclosure, the cavity 185''' of the damper 180''' is also formed in the polysilicon layer 126''' over the silicon substrate 110'''.

According to an embodiment of the present disclosure, the damper 180''' further comprises a polymeric member 190''' comprising a portion 190($u$) located over the cavity 185''' of the damper 180''' along direction X.

According to an embodiment of the present disclosure, the polymeric member 190''' of the damper 180''' surrounds the membrane element 125''' with respect to directions Y and X.

According to an embodiment of the present disclosure, the cavity 185''' of the damper 180''' and the membrane element 125''' are substantially concentric to one another, with the cavity 185''' that encircles the membrane element 125''' along a plane substantially parallel to directions Y and Z.

The presence of the cavity 185''' below the portion 190($u$) of the polymeric member 190''' advantageously ensures that the polymeric member 190''' surrounding the membrane element 125''' efficiently damps undesired free oscillations affecting the membrane element 125'''.

According to an embodiment of the present disclosure, the cavity 185''' of the damper 180''' comprises a trench crossing the polysilicon layer 126''' and a portion of the underlying front operative surface 112''' of the silicon substrate 110''', and extending along direction X. According to an exemplary embodiment of the present disclosure, the length of the cavity 185''' along direction X from the front operative surface 112''' is equal to 15 µm.

According to an embodiment of the present disclosure, the shape of the cavity 185''' along directions Z and Y substantially corresponds to an annulus surrounding the cavity 120''' along directions Z and Y.

According to an embodiment of the present disclosure, the width W(l)''' (intended as the difference between the larger radius and the lower radius of the annulus) of the cavity 185''' at the silicon substrate 110''' has a value equal to or lower than the thickness TH of the membrane element 125'''. According to an embodiment of the present disclosure, the width W(l)''' has a value of 5 µm. According to an embodiment of the present disclosure, the width W(u)''' of the cavity 185''' at the polysilicon layer 126''' is larger than width W(l)''', and has a value ranging from 0.1 to 100 µm.

According to an embodiment of the present disclosure, the shape of the polymeric member 190''' along directions Z and Y substantially corresponds to an annulus.

According to an embodiment of the present disclosure, the polymeric member 190''' comprises:

a lower portion 190($l$)''' having a width corresponding to the width W(u)''' and located in the portion of the cavity 185''' at the polysilicon layer 126'''; and the upper portion 190($u$)''', having a width larger than the width W(u)''' and resting on a top surface of the polysilicon layer 126''', over the cavity 185''' at the silicon substrate 110'''.

In other words, according to this embodiment of the disclosure, the sections of the polymeric member 190''' along a section plane parallel to direction X have a "T" or "mushroom" like shape, with the top portion wider than the lower portion.

According to an embodiment of the present disclosure, the height (along direction X) Ph''' of the upper portion 190($u$)''' of the polymeric member 190''' has a value ranging from 1 to 200 µm. According to an embodiment of the present disclosure, the height Ph''' has a value of 5 µm.

Like the damper 180 of the PMUT device 100 of FIG. 1, thanks to the damper 180''' according to the embodiment of the disclosure illustrated in FIGS. 6 and 7, free oscillations of the membrane element 125''' can be efficiently reduced, thereby increasing the bandwidth of the PMUT device 100'''. For example, in the considered example, in which the PMUT 100''' has a membrane element 125''' oscillating at 1.1 MHz, the % bandwidth centered on 1.1 MHz can advantageously reach 7%.

Figure 8B:
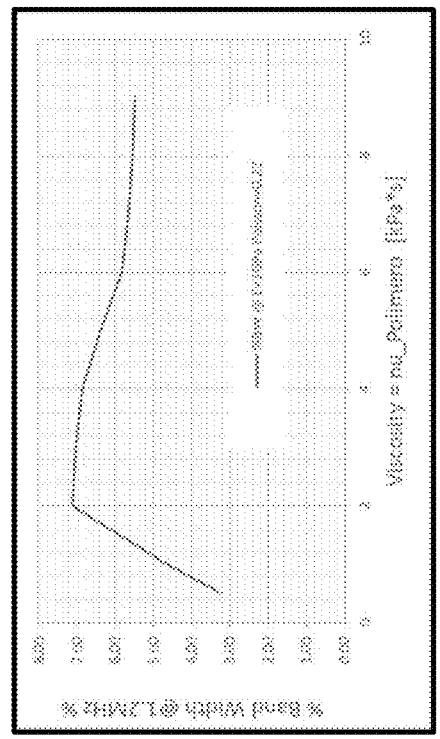
FIG. 8B shows in greater detail an enlarged portion of the diagram of FIG. 8A.
Figure 8A:
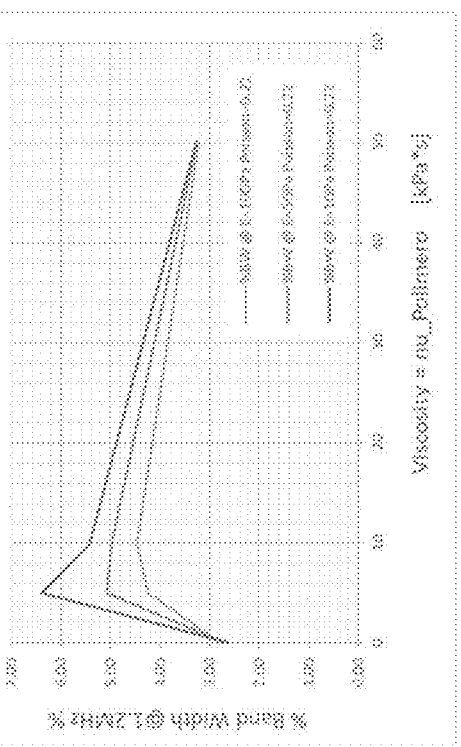
FIG. 8A is a diagram showing the % bandwidth of the PMUT device of FIGS. 6 and 7 as a function of the viscosity and of the Young's modulus of the polymeric material of the polymeric member.

FIG. 8A is a diagram showing the % bandwidth centered on 1.2 MHz of the PMUT device 100''' comprising the damper 180''' according to the embodiments of the disclosure illustrated in FIGS. 6 and 7 as a function of the viscosity of the polymeric material of the polymeric member 190''' when said polymeric material has a Poisson's ratio of 0.22 and a Young's modulus equal to 10 GPa, 5 GPa and 1 GPa.

FIG. 8B shows in greater detail an enlarged portion of the diagram of FIG. 8A corresponding to a viscosity range from 0 to 10 kPa*s and to a Young's modulus equal to 1 GPa.

Applicant found that the efficiency of the damper 180''' according to the embodiments of the disclosure illustrated in FIGS. 6 and 7 in damping undesired free oscillations of the membrane element 125''' is particularly high when the viscosity of the polymeric material of the polymeric member 190''' has a value ranging from 2 to 4 kPa*s and the Young's modulus ranges from 1 MPa to 10 GPa.

FIGS. 9A-9I illustrate main phases of a manufacturing process for manufacturing the PMUT device 100''' of FIGS. 6 and 7 according to an embodiment of the present disclosure.

Figure 9A:
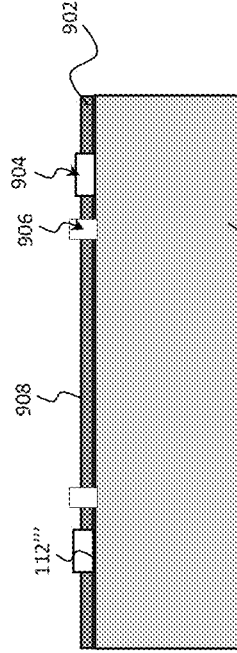
FIGS. 9A-9I illustrate main phases of a manufacturing process for manufacturing the PMUT device of FIGS. 6 and 7 according to an embodiment of the present disclosure.

Making reference to FIG. 9A, the manufacturing process according to this embodiment of the disclosure starts by providing the silicon substrate 110''', deposing an oxide layer 902 on the front operative surface 112''' of the silicon substrate 110'''—for example by means of a LPCVD technique using tetraethyl orthosilicate as precursor—and then selectively etching the oxide layer 902 to uncover portions of the front operative surface 112''' according to the positions where the membrane element 125''' and the cavity 185''' will be formed. Particularly, after the selective etching, the oxide layer 902 is patterned in such a way to comprise:

- a first window 904 which will be used for defining the cavity 185''' (as will be described in details in the following); and
- a second window 906 defining a central portion 908 of the oxide layer 902 which will be used for defining in turn the membrane element 125''' (as will be described in details in the following).

Figure 9B:
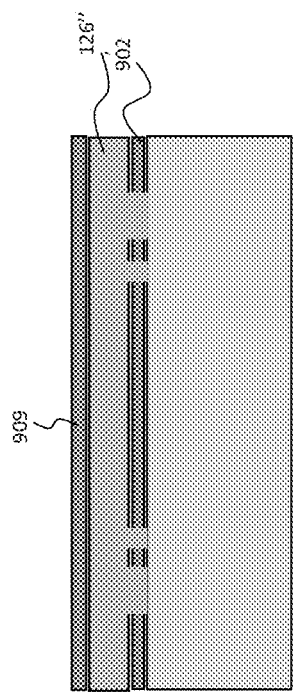

The next phase of the manufacturing process according to this embodiment of the disclosure, illustrated in FIG. 9B, provides for epitaxially growing polysilicon above the front operative surface 112''' of the silicon substrate 110''' and the patterned oxide layer 902 to form the layer of polysilicon layer 126''' used to generate the membrane element 125''' (see FIG. 6). The thickness of the polysilicon layer 126''' with respect to the oxide layer 902 along direction X will define the thickness TH of the membrane element 125''' (see FIG. 6). According to an embodiment of the present disclosure, the poly silicon layer 126''' is grown with a thickness of about 5 µm. According to an embodiment of the present disclosure, this phase of the manufacturing process further comprises the deposition of an insulating material layer 909 (see FIG. 6) over the polysilicon layer 126'''. For example, according to an embodiment of the present disclosure, a layer (e.g., having a thickness of 1 µm) of silicon dioxide is deposed on the polysilicon layer 126''' by means of a LPCVD technique using tetraethyl orthosilicate as precursor.

Figure 9C:
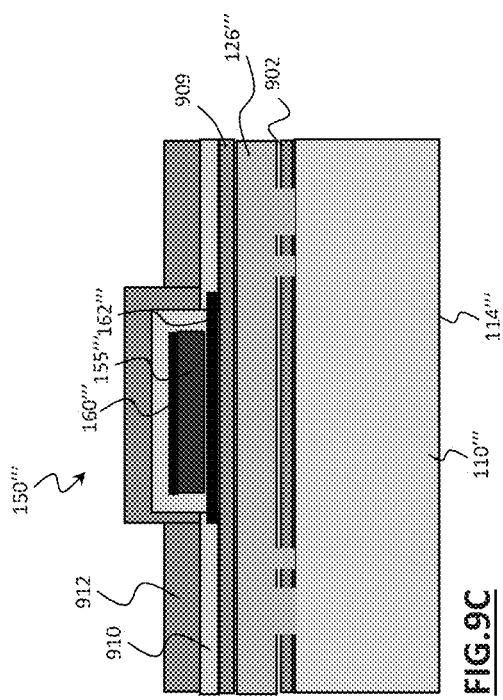

The next phase of the manufacturing process according to this embodiment of the disclosure, illustrated in FIG. 9C, provides for:

- depositing on the insulating material layer 909 a stack comprising a layer of piezoelectric material, e.g., comprising aluminum nitride, between two conductive layers, for example a TiW layer and a platinum layer, and patterning said stack to form the piezoelectric element 150''' by obtaining the layers 155''', 160''', 162''' (see FIG. 6); and
- covering the piezoelectric element 150''' with a first passivation layer 910 (comprising USG) and a second passivation layer 912 (over the first passivation layer 910) comprising Silicon Nitride.

Figure 9E:
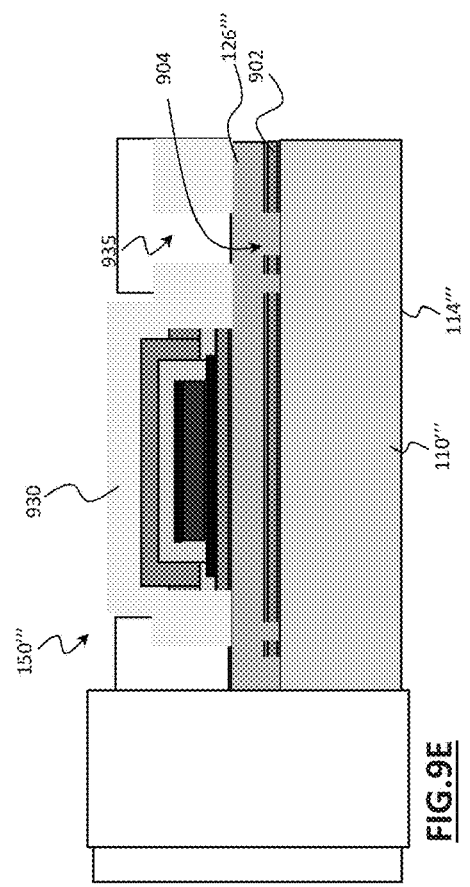
Figure 9D:
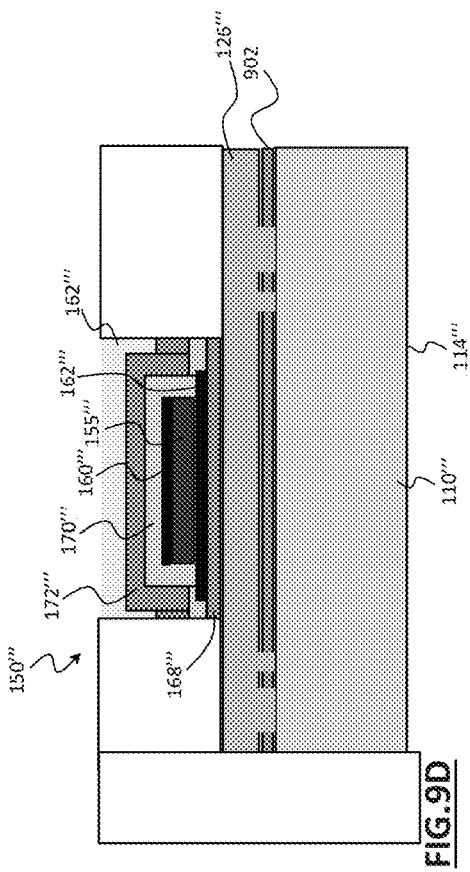

The next phase of the manufacturing process according to this embodiment of the disclosure, illustrated in FIG. 9D, provides for selectively removing the first passivation layer 910, the second passivation layer 912 and the insulating material layer 909 using a properly defined lithographic mask 920 to obtain the first passivation layer 170''', the second passivation layer 172''', and the insulating material layer 168''' (see FIG. 6).

The next phase of the manufacturing process according to this embodiment of the disclosure, illustrated in FIG. 9E, provides for applying a lithographic mask 930 patterned in such a way to include a mask window 935 leave uncovered a portion of the polysilicon layer 126''' aligned to the first window 904 of the oxide layer 902. According to an embodiment of the present disclosure, while the first window 904 of the oxide layer 902 has a width corresponding to the width W(l)''', the width of the mask window 935 corresponds to W(u)''' (see FIG. 6).

Figure 9G:
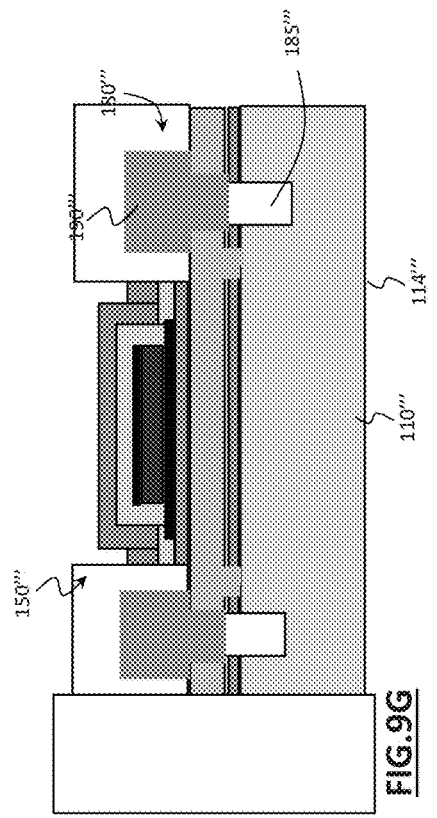
Figure 9F:
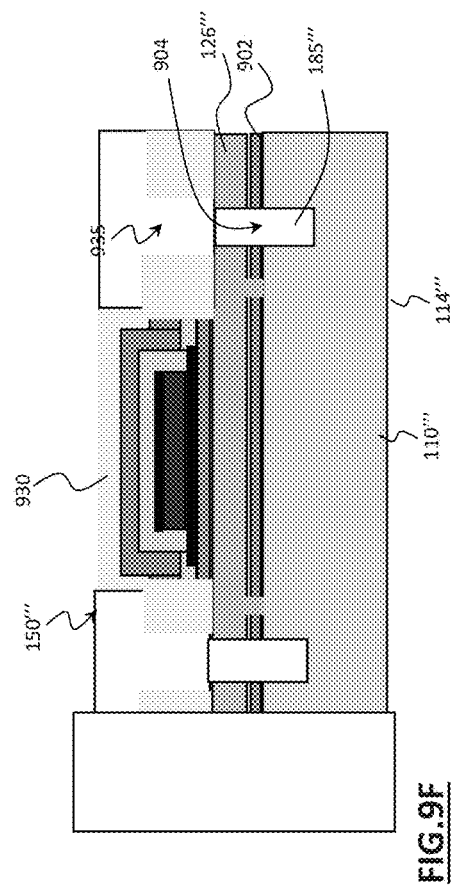

The next phase of the manufacturing process according to this embodiment of the disclosure, illustrated in FIG. 9F, provides for forming the cavity 185''' by opening a trench in the polysilicon layer 126''' and, through the first window 904 of the oxide layer 902, in the underlying silicon substrate 110''' through an etching process exploiting the patterned lithographic mask 930.

The next phase of the manufacturing process according to this embodiment of the disclosure, illustrated in FIG. 9G, provides for removing the lithographic masks 930 and 910, deposing a laminate dry polymer film, partially filling the cavity 185''', and then selectively removing the laminate dry polymer film to obtain the polymeric member 190''' over the cavity 185''.

Figure 9I:
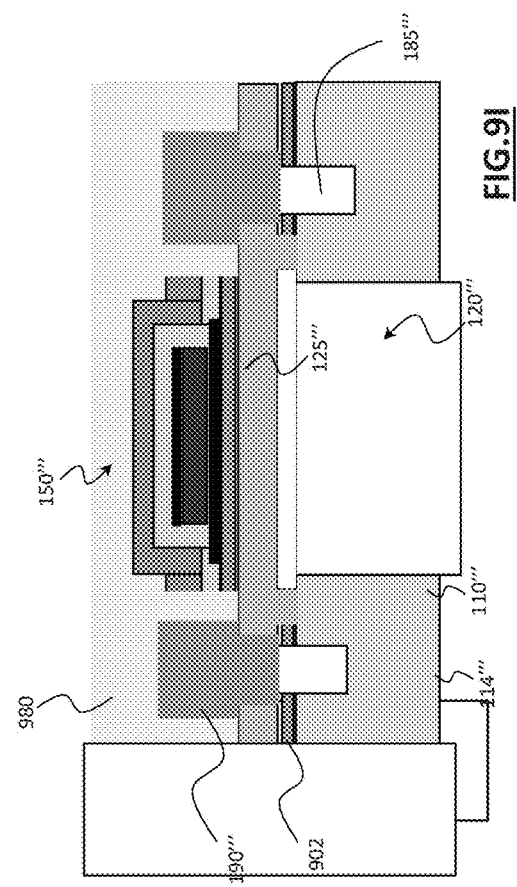
Figure 9H:
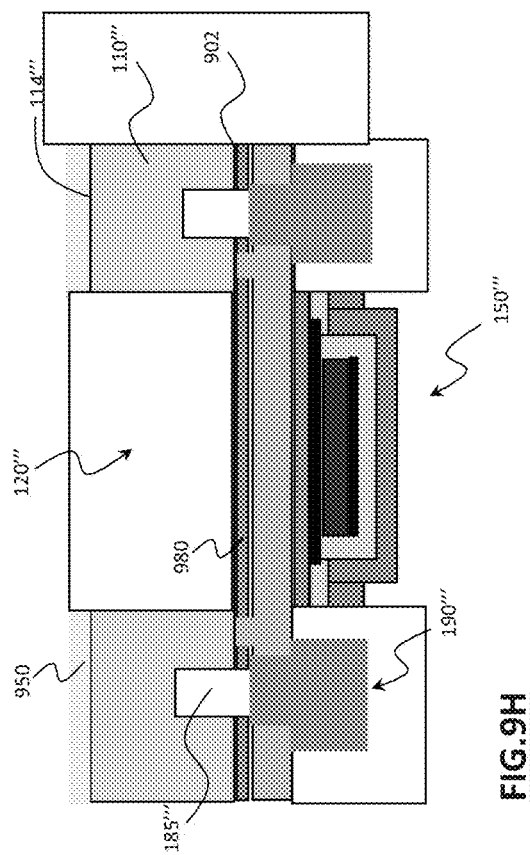

The following phase of the manufacturing process according to this embodiment of the disclosure, illustrated in FIG. 9H, provides for turning upside down the partially manufactured device in such a way that the back operative surface 114''' of the silicon substrate 110''' is facing upward, covering said back operative surface 114''' with a lithographic mask 950 patterned in such a way to uncover a portion of the back operative surface 114''' vertically aligned (i.e., along direction X) to the piezoelectric element 150''' and then performing a dry etch attack to remove the uncovered portion of the silicon substrate 110''' until reaching the central portion 908 of the oxide layer 902 and accordingly defining the cavity 120''' (see FIG. 6).

The last phase of the manufacturing process according to this embodiment of the disclosure, illustrated in FIG. 9I, provides for turning back the partially manufactured device to the original orientation, covering the top portion thereof—i.e., the portion wherein the piezoelectric element 150''' and the polymeric member 190''' are located—with a lithographic mask 980, and then removing the central portion 908 of the oxide layer 902 from below with a wet etching attack to define the membrane element 125'''.

Then, the lithographic mask 980 is removed, and the PMUT device 100''' of FIG. 6 is obtained.

Figure 10:
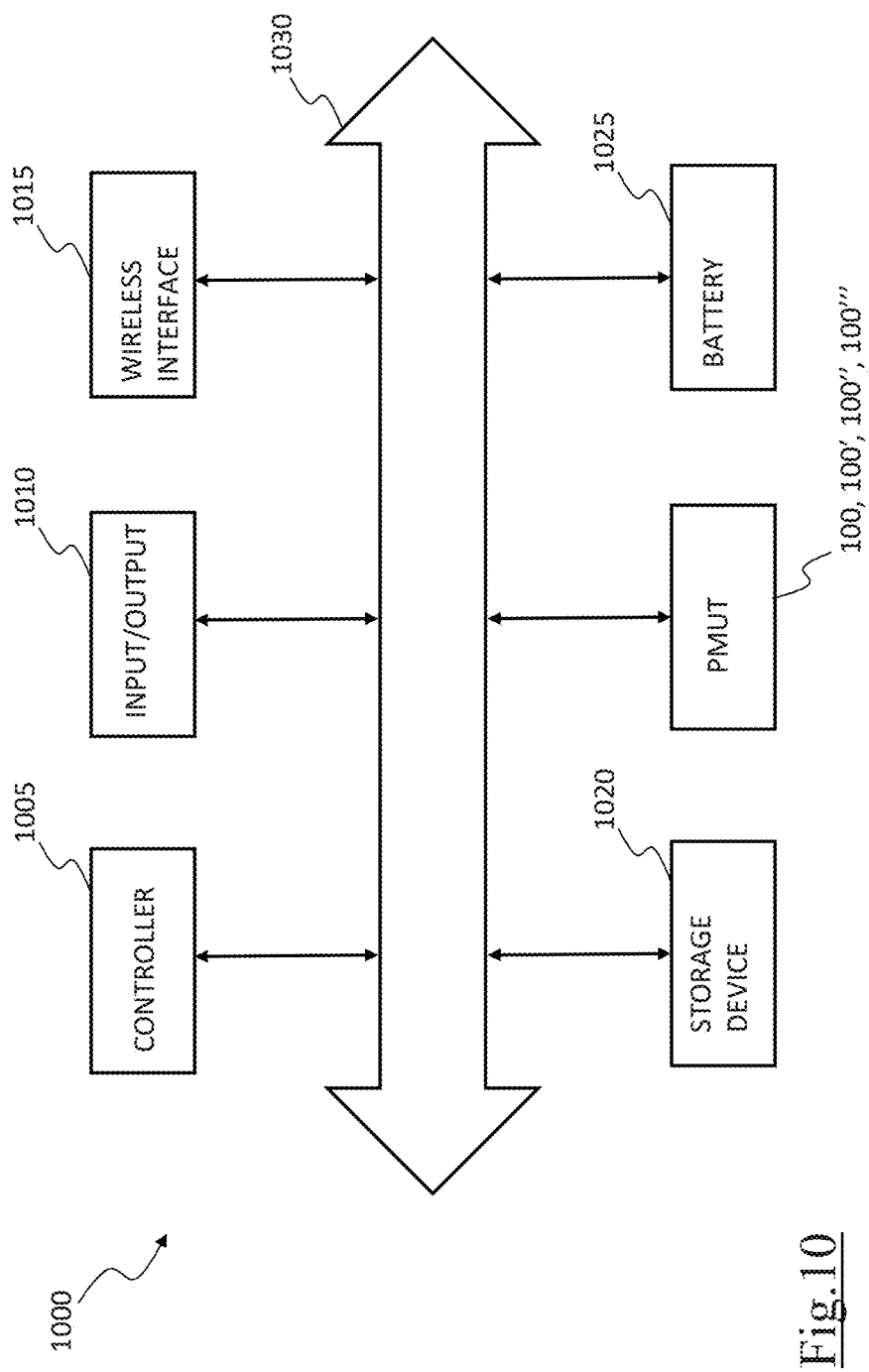
FIG. 10 illustrates in terms of simplified blocks an electronic system comprising at least one of the PMUT devices of FIGS. 1, 5A, 5B, 6.

FIG. 10 illustrates in terms of simplified blocks an electronic system 1000 (or a portion thereof) comprising at least one of the PMUT devices 100, 100', 100'', or 100''' according to the embodiments of the disclosure described above.

According to an embodiment of the present disclosure, the electronic system 1000 is adapted to be used in electronic devices such as for example personal digital assistants, computers, tablets, and smartphones.

According to an embodiment of the present disclosure, the electronic system 1000 may comprise, in addition to the PMUT device 100, 100', 100'', or 100''', a controller 1005, such as for example one or more microprocessors and/or one or more microcontrollers.

According to an embodiment of the present disclosure, the electronic system 1000 may comprise, in addition to the PMUT device 100, 100', 100'', or 100''', an input/output device 1010 (such as for example a keyboard, and/or a touch screen and/or a visual display) for generating/receiving messages/commands/data, and/or for receiving/sending digital and/or analogic signals.

According to an embodiment of the present disclosure, the electronic system 1000 may comprise, in addition to the PMUT device 100, 100', 100'', or 100''', a wireless interface 1015 for exchanging messages with a wireless communication network (not shown), for example through radiofrequency signals. Examples of wireless interface 1015 may comprise antennas and wireless transceivers.

According to an embodiment of the present disclosure, the electronic system 1000 may comprise, in addition to the PMUT device 100, 100', 100", or 100''', a storage device 1020, such as for example a volatile and/or a non-volatile memory device.

According to an embodiment of the present disclosure, the electronic system 1000 may comprise, in addition to the PMUT device 100, 100', 100", or 100''', a supply device, for example a battery 1025, for supplying electric power to the electronic system 1000.

According to an embodiment of the present disclosure, the electronic system 1000 may comprise one or more communication channels (buses) for allowing data exchange between the PMUT device 100, 100', 100", or 100''' and the controller 1005, and/or the input/output device 1010, and/or the wireless interface 1015, and/or the storage device 1020, and/or the battery 1025, when they are present.

Naturally, in order to satisfy local and specific requirements, a person skilled in the art may apply to the solution described above many logical and/or physical modifications and alterations. More specifically, although the present disclosure has been described with a certain degree of particularity with reference to preferred embodiments thereof, it should be understood that various omissions, substitutions and changes in the form and details as well as other embodiments are possible. In particular, different embodiments of the disclosure may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the disclosure may be incorporated in other embodiments.

A PMUT device, (100; 100'; 100"; 100''') may be summarized as including: a membrane element (125; 125'; 125"; 125''') adapted to generate and receive ultrasonic waves by oscillating, about an equilibrium position, at a corresponding resonance frequency; a piezoelectric element (150; 150'; 150"; 150''') located over the membrane element along a first direction (X) and configured to: cause the membrane element to oscillate when electric signals are applied to the piezoelectric element; and generate electric signals in response to oscillations of the membrane element; and a damper (180; 180'; 180"; 180''') configured to reduce free oscillations of the membrane element, the damper comprising: a damper cavity (185; 185'; 185"; 185''') surrounding the membrane element; and a polymeric member (190; 190'; 190"; 190''') having at least a portion thereof over the damper cavity along the first direction.

The damper cavity (185; 185'; 185"; 185''') may encircle the membrane element along a plane substantially perpendicular to the first direction (X).

The PMUT device (100; 100'; 100"; 100''') my further include a semiconductor substrate, (110; 110'; 110"; 110'''), the damper cavity (185; 185'; 185"; 185''') being at least partially formed in the semiconductor substrate.

The PMUT device (100; 100'; 100"; 100''') may further include a central cavity (120; 120'; 120"; 120''') under the membrane element (125; 125'; 125"; 125''') along the first direction, (X) the damper cavity (185; 185'; 185"; 185''') having at least a portion corresponding to an annulus surrounding the central cavity perpendicularly to the first direction (X).

The polymeric member (190; 190'; 190"; 190''') may have a shape along directions perpendicular to the first direction substantially corresponding to an annulus. The polymeric member (190; 190') may have: a viscosity value ranging from 0.3 to 3 kPa*s; and a Young's modulus value ranging from 0.5 to 2 GPa. The membrane element (125; 125') may include monocrystalline silicon. The polymeric member (190''') may have: a viscosity value ranging from 2 to 4 kPa*s; and a Young's modulus value ranging from 1 MPa to 10 GPa. The membrane element (125"; 125''') may include polysilicon. The membrane element (125") may include porous polysilicon.

An electronic system (1000) may include one or more PMUT devices.

A method for manufacturing a PMUT device (100; 100'; 100"; 100''') may be summarized as including the following phases: forming a membrane element (125; 125'; 125"; 125'''); forming over the membrane element along a first direction (X) a piezoelectric element (150; 150'; 150"; 150'''); and forming a damper, (180; 180'; 180"; 180'''), the forming a damper may include: forming damper cavity (185; 185'; 185"; 185''') surrounding the membrane element; and forming a polymeric member (190; 190'; 190"; 190''') having at least a portion thereof over the damper cavity along the first direction.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A Piezoelectric Micromachined Ultrasonic Transducer (PMUT) device, comprising:
   a membrane element configured to generate and receive ultrasonic waves by oscillating about an equilibrium position at a corresponding resonance frequency;
   a piezoelectric element located over the membrane element along a first direction and configured to:
      cause the membrane element to oscillate when electric signals are applied to the piezoelectric element; and
      generate electric signals in response to oscillations of the membrane element; and
   a damper configured to reduce free oscillations of the membrane element, the damper including:
      a damper cavity surrounding the membrane element; and
      a polymeric member having at least a portion thereof over the damper cavity along the first direction.

2. The PMUT device of claim 1, wherein the damper cavity encircles the membrane element along a plane substantially perpendicular to the first direction.

3. The PMUT device of claim 1, further comprising a semiconductor substrate, the damper cavity being at least partially formed in the semiconductor substrate.

4. The PMUT device of claim 1, further comprising a central cavity under the membrane element along the first direction, the damper cavity having at least a portion corresponding to an annulus surrounding the central cavity perpendicularly to the first direction.

5. The PMUT device of claim 1, wherein the polymeric member has a shape along directions perpendicular to the first direction substantially corresponding to an annulus.

6. The PMUT device of claim 1, wherein the polymeric member has:
   a viscosity value within a range from 0.3 kPa*s to 3 kPa*s; and a Young's modulus value within a range from 0.5 GPa to 2 GPa.

7. The PMUT device of claim 1, wherein the membrane element comprises monocrystalline silicon.

8. The PMUT device of claim 1, wherein the polymeric member has:
a viscosity value ranging from 2 to 4 kPa*s; and
a Young's modulus value ranging from 1 MPa to 10 GPa.

9. The PMUT device of claim 8, wherein the membrane element comprises polysilicon.

10. The PMUT device of claim 9, wherein the membrane element comprises porous polysilicon.

11. An electronic system, comprising:
a Piezoelectric Micromachined Ultrasonic Transducer (PMUT) device, including:
a membrane element configured to generate and receive ultrasonic waves by oscillating about an equilibrium position at a corresponding resonance frequency;
a piezoelectric element located over the membrane element along a first direction and configured to:
cause the membrane element to oscillate when electric signals are applied to the piezoelectric element; and
generate electric signals in response to oscillations of the membrane element; and
a damper configured to reduce free oscillations of the membrane element, the damper including:
a damper cavity surrounding the membrane element; and
a polymeric member having at least a portion thereof over the damper cavity along the first direction; and
a controller coupled to the PMUT device.

12. The electronic system of claim 11, further comprising an input/output device coupled to the PMUT device and to the controller.

13. The electronic system of claim 11, further comprising a wireless interface coupled to the PMUT device and to the controller.

14. The electronic system of claim 11, further comprising a memory device coupled to the PMUT device and to the controller.

15. The electronic system of claim 11, wherein the damper cavity encircles the membrane element along a plane substantially perpendicular to the first direction.

16. The electronic system of claim 11, wherein the PMUT device includes a central cavity under the membrane element along the first direction, the damper cavity having at least a portion corresponding to an annulus surrounding the central cavity perpendicularly to the first direction.

17. A method for manufacturing a PMUT device, comprising:
forming a membrane element;
forming over the membrane element along a first direction a piezoelectric element; and
forming a damper, the forming a damper including:
forming damper cavity surrounding the membrane element; and
forming a polymeric member having at least a portion thereof over the damper cavity along the first direction.

18. The method of claim 17, wherein forming the damper cavity includes forming the damper cavity encircling the membrane element along a plane substantially perpendicular to the first direction.

19. The method of claim 17, wherein forming the damper cavity includes forming the damper cavity at least partially in a semiconductor substrate.

20. The method of claim 17, further comprising forming a central cavity under the membrane element along the first direction, the damper cavity having at least a portion corresponding to an annulus surrounding the central cavity perpendicularly to the first direction.

* * * * *